(12) United States Patent
Kawana et al.

(10) Patent No.: US 11,890,681 B2
(45) Date of Patent: Feb. 6, 2024

(54) METHOD FOR PRODUCING BONDED OBJECT AND SEMICONDUCTOR DEVICE AND COPPER BONDING PASTE

(71) Applicant: Showa Denko Materials Co., Ltd., Tokyo (JP)

(72) Inventors: Yuki Kawana, Tokyo (JP); Hideo Nakako, Tokyo (JP); Motohiro Negishi, Tokyo (JP); Chie Sugama, Tokyo (JP); Yoshinori Ejiri, Tokyo (JP); Yuichi Yanaka, Tokyo (JP)

(73) Assignee: RESONAC CORPORATION, Tokyo (JP)

(*) Notice: Subject to any disclaimer, the term of this patent is extended or adjusted under 35 U.S.C. 154(b) by 304 days.

(21) Appl. No.: 17/296,986

(22) PCT Filed: Nov. 29, 2018

(86) PCT No.: PCT/JP2018/044068
§ 371 (c)(1),
(2) Date: May 26, 2021

(87) PCT Pub. No.: WO2020/110271
PCT Pub. Date: Jun. 4, 2020

(65) Prior Publication Data
US 2022/0028824 A1    Jan. 27, 2022

(51) Int. Cl.
*B22F 7/00* (2006.01)
*B22F 7/06* (2006.01)
(Continued)

(52) U.S. Cl.
CPC .............. *B22F 7/00* (2013.01); *B22F 1/054* (2022.01); *B22F 1/056* (2022.01); *B22F 1/10* (2022.01);
(Continued)

(58) Field of Classification Search
CPC .... B23K 35/025; B23K 20/233; B23K 20/16; B23K 20/026; B23K 35/0244;
(Continued)

(56) References Cited

U.S. PATENT DOCUMENTS 4,724,040 A * 2/1988 Iwasa .................. H05K 3/4664
427/102
6,096,411 A * 8/2000 Nakatani ................ C08K 3/08
428/209

(Continued)

FOREIGN PATENT DOCUMENTS

JP    2012046779    3/2012
JP    4928639    5/2012
(Continued)

OTHER PUBLICATIONS

R. Khazaka et al., "Review on Joint Shear Strength of Nano-Silver Paste and Its Long-Term High Temperature Reliability", Journal of Electronic Materials, vol. 43, Jul. 2014, pp. 2459-2466.
(Continued)

*Primary Examiner* — Mouloucoulaye Inoussa
(74) *Attorney, Agent, or Firm* — JCIPRNET (57) ABSTRACT

An embodiment of the present invention provides a method for producing a bonded object. The method comprises a step for preparing a laminate in which a first member, a copper bonding paste, and a second member are laminated in order and a step for sintering the copper bonding paste under a pressure of 0.1-1 MPa. The copper bonding paste contains metal particles and a dispersion medium, wherein the content of metal particles is at 50 mass % or more with respect to the total mass of the copper bonding paste, and the metal particles contain 95 mass % or more of submicro copper particles with respect to the total mass of the metal particles.

9 Claims, 5 Drawing Sheets

(51) Int. Cl.
*H01L 23/00* (2006.01)
*B22F 1/054* (2022.01)
*B22F 1/10* (2022.01)

(52) U.S. Cl.
CPC .............. *B22F 7/064* (2013.01); *H01L 24/29* (2013.01); *H01L 24/83* (2013.01); *H01L 2224/29294* (2013.01); *H01L 2224/29347* (2013.01); *H01L 2224/8384* (2013.01)

(58) Field of Classification Search
CPC .. B23K 35/302; B23K 35/262; B23K 1/0016; B23K 35/3618; B23K 35/3006; B23K 35/365; B23K 35/34; B23K 2101/36; C22C 1/0425; C22C 23/00; C22C 13/00; H01L 24/29; H01L 24/84; H01L 24/27; H01L 24/83; H01L 23/3121; H01L 23/3736; H01L 21/568; H01L 21/6836; H01L 23/528; H01L 23/53252; H01L 21/76841; H01L 23/53266; H01L 2224/83457; H01L 2224/83447; H01L 2224/83471; H01L 2224/83438; H01L 2224/83439; H01L 2224/83449; H01L 2924/13091; H01L 2224/8384; H01L 2224/73263; H01L 2224/92247; H01L 2224/40225; H01L 2224/27442; H01L 2224/83424; H01L 2924/181; H01L 2224/73265; H01L 2224/32225; H01L 2224/48227; H01L 2924/00012; H01L 2224/48472; H01L 2224/29286; H01L 2224/2732; H01L 2224/743; H01L 2224/83192; H01L 2224/83194; H01L 2224/83825; H01L 2224/29499; H01L 2224/27312; H01L 2224/2928; H01L 2224/29255; H01L 2224/29247; H01L 2224/29239; H01L 2224/05647; H01L 2224/8382; H01L 2224/29355; B22F 1/056; B22F 1/10; B22F 7/064; B22F 7/00; B22F 1/054; B22F 3/14; B22F 1/17; B22F 1/068; B22F 1/102; B22F 1/09; B22F 1/107; B22F 2999/00; B22F 2003/145; B22F 2202/06; B22F 2301/255; C23C 20/04; H10N 10/80; H10N 10/01; H10N 10/17; H10N 10/851; C09J 11/04; C09J 7/20; C09J 9/02; C09J 201/00; C09J 7/10; C09J 2203/326; C08K 2003/085
USPC ......... 257/774, 780, 783, 779, 782, 772, 71, 257/676, 686, E23.04, E21.51, E23.028, 257/E23.092, 738, E23.105; 438/455; 361/736; 228/248.1, 180.22, 207; 148/24

See application file for complete search history.

(56) References Cited

U.S. PATENT DOCUMENTS

| | | | |
|---|---|---|---|
| 6,221,506 B1* | 4/2001 | Guerlet | B23P 15/16 420/466 |
| 2011/0210455 A1* | 9/2011 | Oonishi | H01L 24/83 428/354 |
| 2013/0008698 A1* | 1/2013 | Himori | H05K 3/4069 174/251 |
| 2013/0213691 A1* | 8/2013 | Park | H01B 13/00 156/247 |
| 2014/0138850 A1* | 5/2014 | Takayama | H01L 23/49827 438/455 |
| 2015/0053753 A1* | 2/2015 | Komatsu | B23K 1/20 228/248.1 |
| 2016/0129530 A1* | 5/2016 | Greve | B23K 35/262 75/228 |
| 2016/0254243 A1* | 9/2016 | Kurita | B22F 1/107 228/123.1 |
| 2016/0293820 A1* | 10/2016 | Tohei | C22C 23/00 |
| 2017/0252801 A1* | 9/2017 | Ida | H01B 5/00 |
| 2018/0056449 A1* | 3/2018 | Zhu | B23K 35/3033 |
| 2018/0061520 A1* | 3/2018 | Kajita | H01L 24/29 |
| 2018/0147673 A1* | 5/2018 | Schmitt | B22F 1/17 |
| 2018/0250751 A1* | 9/2018 | Kawana | B22F 1/00 |
| 2018/0269175 A1* | 9/2018 | Sugo | C09J 11/04 |
| 2018/0277507 A1* | 9/2018 | Sugo | H01L 24/29 |
| 2018/0342478 A1* | 11/2018 | Nakako | H01L 24/73 |
| 2019/0270881 A1* | 9/2019 | Shim | B32B 5/02 |
| 2019/0355690 A1* | 11/2019 | Nakako | B22F 7/064 |
| 2020/0006243 A1* | 1/2020 | Tanigaki | H01L 21/477 |
| 2020/0176411 A1* | 6/2020 | Kawana | B32B 9/041 |

FOREIGN PATENT DOCUMENTS

| | | |
|---|---|---|
| JP | 5006081 | 8/2012 |
| JP | 2014167145 | 9/2014 |
| JP | 2015004122 | 1/2015 |
| JP | 2015517184 | 6/2015 |
| JP | 2015220422 | 12/2015 |
| JP | 2017071826 | 4/2017 |
| JP | 2017133083 | 8/2017 |
| JP | 2017147151 | 8/2017 |
| JP | 2018152176 | 9/2018 |
| KR | 1020180050712 | 5/2018 |
| WO | 2015029152 | 3/2015 |
| WO | 2018131095 | 7/2018 |
| WO | 2018168187 | 9/2018 |

OTHER PUBLICATIONS

Katsuhiro Ueda et al., "Obtainment of Sectional Area of Stearic AcidMolecule—Experimental Value and Calculated Value—", Chemistry& Education, vol. 40, Feb. 1992, with English translation thereof, p. 114-p. 117.

* cited by examiner

METHOD FOR PRODUCING BONDED OBJECT AND SEMICONDUCTOR DEVICE AND COPPER BONDING PASTE

CROSS-REFERENCE TO RELATED APPLICATION

This application is a 371 application of the international PCT application serial no. PCT/JP2018/044068 on Nov. 29, 2018. The entirety of the above-mentioned patent application is hereby incorporated by reference herein and made a part of this specification.

TECHNICAL FIELD

The present invention relates to a method for producing a bonded object and a semiconductor device, and a copper bonding paste.

BACKGROUND ART

When semiconductor devices are produced, various bonding materials are used to bond a semiconductor element and a lead frame or the like (support member). Among semiconductor devices, high melting point lead solder has been used as a bonding material for bonding power semiconductors, LSIs, and the like that operate at a high temperature of 150° C. or higher. In recent years, due to an increased capacity and space saving of semiconductor elements, the operation temperature has risen to near the melting point of high melting point lead solder, and it has become difficult to secure connection reliability. On the other hand, lead-free bonding materials are required according to tightening of RoHS regulations.

So far, bonding of semiconductor elements using a material other than lead solder has been studied. For example, the following Patent Literature 1 proposes a technology for sintering silver nanoparticles at a low temperature and forming a sintered silver layer. It is known that such sintered silver has high connection reliability for power cycles (Non-Patent Literature 1).

A technology for sintering copper particles as still another material and forming a sintered copper layer is also proposed. For example, the following Patent Literature 2 discloses a bonding paste containing copper (II) oxide particles and a reducing agent as a bonding material for bonding a semiconductor element and an electrode. In addition, the following Patent Literature 3 discloses a bonding material containing copper nanoparticles, and copper microparticles or copper submicro particles, or a bonding material containing both of them.

CITATION LIST

Patent Literature

[Patent Literature 1]
  Japanese Patent No. 4928639
[Patent Literature 2]
  Japanese Patent No. 5006081
[Patent Literature 3]
  Japanese Patent Laid-Open No. 2014-167145

Non-Patent Literature

[Non-Patent Literature 1]
  R. Khazaka, L. Mendizabal, D. Henry: J. ElecTron. Mater, 43 (7), 2014, 2459-2466

SUMMARY OF INVENTION

Technical Problem

The method described in Patent Literature 1 requires a thermocompression bonding process according to pressurization because densification of a sintered silver layer is essential in order to obtain high connection reliability. In Patent Literature 1, pressurization is performed at 5 MPa, pressurization by a thermal pressurizing device is required, and when such a thermocompression bonding process is performed, there are problems such as a decrease in production efficiency and a decrease in the yield. In addition, when silver nanoparticles are used, there is a problem such as a significant increase in material costs due to silver.

In the method described in Patent Literature 2, the volumetric shrinkage when copper oxide is reduced to copper is avoided according to the thermocompression bonding process. In the thermocompression bonding process, the volumetric shrinkage in the thickness direction when copper oxide is reduced to copper can be avoided, but copper oxide particles themselves shrink in volume when reduced to copper. Thereby, it is difficult to minimize volumetric shrinkage in the surface direction and cracks in the bonding layer formed of a sintered copper layer can be a problem.

In the method described in Patent Literature 3, sintering is performed without pressurization, but it is not yet sufficient for practical use in the following aspects. That is, it is necessary to modify the surface of copper nanoparticles with a protecting agent in order to minimize oxidation and improve dispersibility. However, since the copper nanoparticles have a large specific surface area, the amount of the surface protecting agent added tends to be high in the bonding material containing copper nanoparticles as a main component. In addition, in order to secure dispersibility, the amount of the dispersion medium added tends to be high. Therefore, for the bonding material described in Patent Literature 3, the proportion of the surface protecting agent or the dispersion medium required is high for stability such as in storage or coating. Therefore, the volumetric shrinkage during sintering tends to be high, denseness after sintering tends to be low, and it is difficult to secure strength for a sintered object.

An objective of the present invention is to provide a method for producing a bonded object and a method for producing a semiconductor device through which a bonded object having excellent bonding strength can be obtained without the need for bonding at a high pressure. Another objective of the present invention is to provide a copper bonding paste having excellent applicability suitable for the production method.

Solution to Problem

The present invention provides a method for producing a bonded object including a step of preparing a laminate in which a first member, a copper bonding paste, and a second member are laminated in order and a step of sintering the copper bonding paste under a pressure of 0.1 to 1 MPa, wherein the copper bonding paste contains metal particles and a dispersion medium, the content of the metal particles with respect to a total mass of the copper bonding paste is 50 mass % or more, and the metal particles contain 95 mass % or more of submicro copper particles with respect to a total mass of the metal particles.

The present invention also provides a method for producing a semiconductor device including a step of preparing a laminate in which a first member, a copper bonding paste, and a second member are laminated in order and a step of sintering the copper bonding paste under a pressure of 0.1 to 1 MPa, wherein at least one of the first member and the second member is a semiconductor element, the copper bonding paste contains metal particles and a dispersion medium, the content of the metal particles with respect to a total mass of the copper bonding paste is 50 mass % or more, and the metal particles contain 95 mass % or more of submicro copper particles with respect to a total mass of the metal particles.

According to the method for producing a bonded object and the method for producing a semiconductor device of the present invention, it is possible to obtain a bonded object and a semiconductor device which have excellent bonding strength without the need to perform bonding at a high pressure by using a special thermal pressurizing device or the like. The reason why such an effect is obtained is considered to be that, when submicro copper particles are used for the copper bonding paste, it is possible to sufficiently minimize volumetric shrinkage during sintering due to the surface protecting agent of the submicro copper particles and/or the dispersion medium of the copper bonding paste. It is considered that, since the volumetric shrinkage during sintering is minimized, the copper bonding paste can be sintered at a high temperature, and as a result, it is possible to secure the strength of the sintered object and improve the bonding strength with respect to an adherend surface. In addition, according to the production method, it is possible to produce a bonded object and a semiconductor device more inexpensively and stably compared to when a bonding material containing expensive copper nanoparticles as a main component is used. Thereby, it is possible to further improve the production stability.

In addition, when the bonded object produced by the production method of the present invention includes a copper sintered object having excellent thermal conductivity, heat dissipation of the member can also be excellent.

In addition, the semiconductor device obtained by the production method of the present invention has sufficient bonding strength, and when it includes a copper sintered object having high thermal conductivity and a high melting point, it has sufficient die shear strength, and excellent connection reliability and also has excellent power cycle resistance.

The present invention also provides a copper bonding paste containing metal particles and a dispersion medium, wherein the content of the metal particles with respect to a total mass of the copper bonding paste is 50 mass % or more, and wherein the metal particles contain 95 mass % or more of submicro copper particles with respect to a total amount of the metal particles.

Since the copper bonding paste is unlikely to undergo volumetric shrinkage during sintering, it is possible to produce a bonded object having excellent bonding strength without performing pressurization at a high pressure.

The metal particles may contain 5 mass % or less of micro copper particles with respect to a total mass of the metal particles.

In the copper bonding paste, the viscosity of the copper bonding paste at 25° C. may be 0.8 to 40,000 Pa·s. Thereby, it is possible to obtain a bonded object or a semiconductor device having excellent strength while facilitating production according to applications.

In the copper bonding paste, the dispersion medium may be at least one selected from the group consisting of alcohols and ethers. Thereby, the applicability of the copper bonding paste can be further improved.

In the copper bonding paste, the aspect ratio of the submicro copper particles may be 5 or less. Thereby, it is possible to prevent submicro particles from being arranged in a non-uniform direction during the pressurizing step and it is possible to minimize the occurrence of voids in the bonded object.

Advantageous Effects of Invention

According to the present invention, it is possible to provide a method for producing a bonded object and a method for producing a semiconductor device through which a bonded object having excellent bonding strength can be obtained without the need for bonding at a high pressure. According to the present invention, it is also possible to provide a copper bonding paste having excellent applicability suitable for the production method.

DESCRIPTION OF EMBODIMENTS

A form for implementing the present invention (hereinafter referred to as "the present embodiment") will be described below in detail appropriately with reference to the drawings. The present invention is not limited to the following embodiment.

<Method for Producing Bonded Object>

Figure 1:
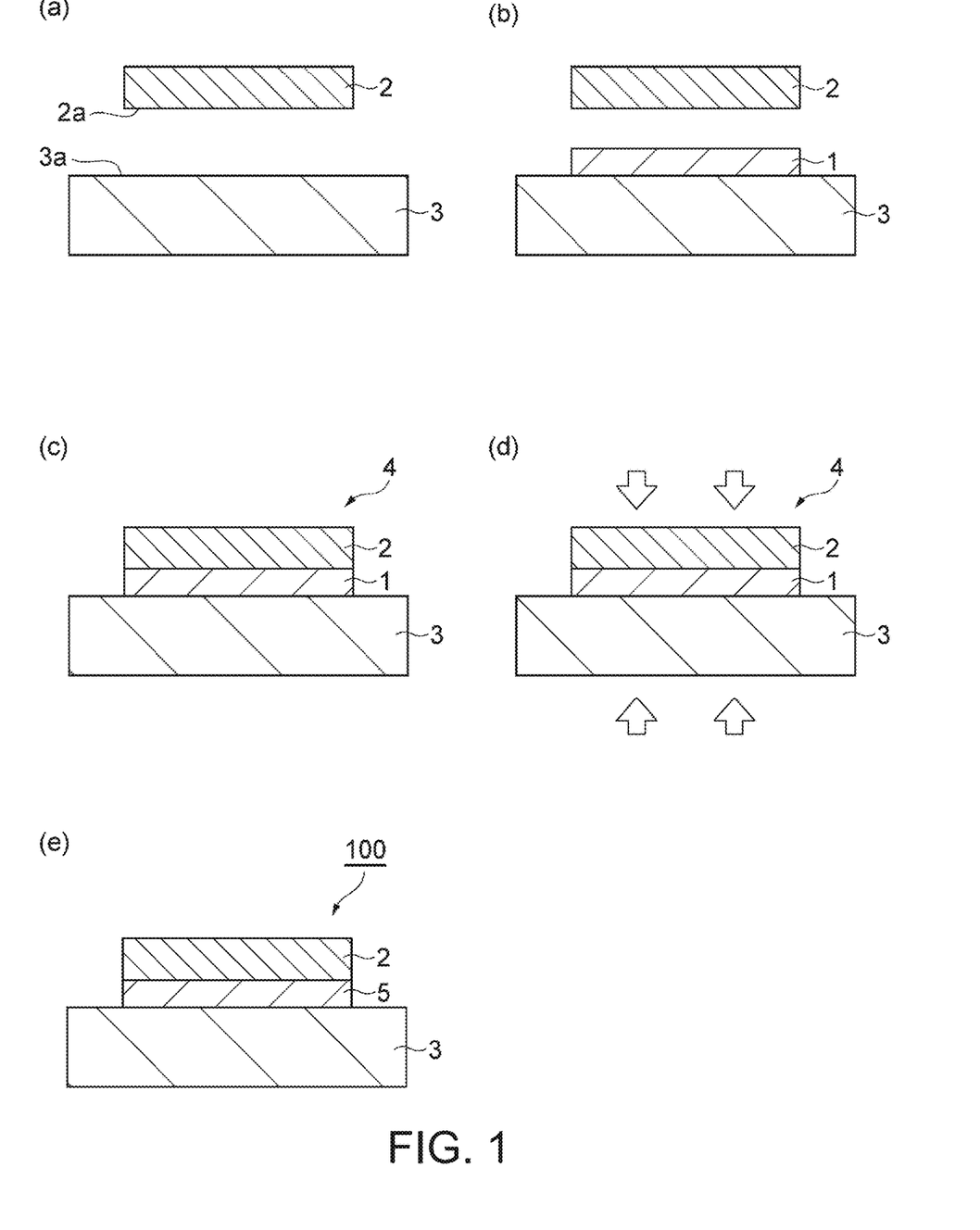
FIG. 1 is a schematic cross-sectional view for explaining a method for producing a bonded object according to one embodiment.

FIG. 1 is a schematic cross-sectional view for explaining a method for producing a bonded object according to one embodiment. The method for producing a bonded object according to one embodiment includes a step of preparing a laminate in which a first member, a copper bonding paste, and a second member are laminated in order (preparation step) and step of sintering the copper bonding paste under a pressure of 0.1 to 1 MPa (sintering step).

[Preparation Step]

In one embodiment, the preparation step may be a step of producing a laminate. In the preparation step, first, as shown in FIG. 1(*a*), a first member 2 and a second member 3 are prepared.

(First Member and Second Member)

Regarding the first member 2 and the second member 3, for example, semiconductor elements such as an IGBT, a diode, a Schottky barrier diode, an MOS-FET, a thyristor, a logic circuit, a sensor, an analog integrated circuit, an LED, a semiconductor laser, and a transmitter, base materials for mounting semiconductor elements such as a lead frame, a ceramic substrate with a metal plate attached (for example, DBC), and an LED package, power supply members such as a copper ribbon, a metal block, and a terminal, a heat dissipation plate, and a water cooling plate may be exemplified.

The first member 2 and the second member 3 may contain a metal on surfaces 2a and 3a in contact with a copper bonding paste to be described below. Examples of metals include copper, nickel, silver, gold, palladium, platinum, lead, tin, and cobalt. The metals may be used alone or two or more thereof may be used in combination. In addition, the surfaces 2a and 3a in contact with the copper bonding paste may contain an alloy containing the above metal. Examples of metals used for the alloy include zinc, manganese, aluminum, beryllium, titanium, chromium, iron, and molybdenum in addition to the above metals. Examples of members containing a metal on the surface in contact with a sintered object include a member having various metal platings, a wire, a chip having a metal plating, a heat spreader, a ceramic substrate to which a metal plate is attached, a lead frame having various metal platings or a lead frame made of various metals, a copper plate, and a copper foil.

Next, as shown in FIG. 1(b), a copper bonding paste 1 is disposed between the first member 2 and the second member 3, and as shown in FIG. 1(c), a laminate 4 in which the first member 2, the copper bonding paste 1, and the second member 3 are laminated in order is produced. The copper bonding paste 1 will be described below in detail.

In order to produce the laminate 4, for example, as shown in FIG. 1(b), the copper bonding paste 1 is provided on a necessary part of the second member 3, and the first member 2 is then disposed on the copper bonding paste 1. The method for producing the laminate 4 is not limited to the method shown in FIG. 1(b), and the copper bonding paste 1 may be provided on a necessary part of the first member 2, and the first member 2 on which the copper bonding paste 1 is provided may be disposed on the second member 3.

Regarding a method for providing the copper bonding paste 1 on a necessary part of the second member 3 or the first member 2, any method may be used as long as the copper bonding paste can be deposited. For such a method, for example, screen printing, transfer printing, offset printing, a jet printing method, a dispenser, a jet dispenser, a needle dispenser, a comma coater, a slit coater, a die coater, a gravure coater, a slit coater, letterpress printing, intaglio printing, gravure printing, stencil printing, soft lithography, a bar coater, an applicator, a particle deposition method, a spray coater, a spin coater, a dip coater, electrodeposition coating, and the like can be used.

The thickness of the copper bonding paste 1 may be 1 μm or more and 1,000 μm or less, 10 μm or more and 500 μm or less, 50 μm or more and 200 μm or less, 10 μm or more and 3,000 μm or less, 15 μm or more and 500 μm or less, 20 μm or more and 300 μm or less, 5 μm or more and 500 μm or less, 10 μm or more and 250 μm or less, or 15 μm or more and 150 μm or less.

For a method for disposing the first member 2 on the copper bonding paste 1 or a method for disposing the first member 2 on which the copper bonding paste 1 is provided on the second member 3, for example, a chip mounter, a flip chip bonder, or a carbon or ceramic positioning jig may be used.

(Copper Bonding Paste)

The copper bonding paste 1 contains metal particles and a dispersion medium.

The metal particles contain 95 mass % or more of submicro copper particles with respect to a total mass of the metal particles. Since submicro copper particles have favorable sinterability, it is thereby possible to mitigate problems such as high synthesis costs, and poor dispersibility, and to reduce the volumetric shrinkage after sintering, which are observed in a bonding material mainly using copper nanoparticles.

In this specification, the submicro copper particles are copper particles having a volume average particle size of 0.12 μm or more and 0.8 μm or less.

Here, in this specification, the volume average particle size means a 50% volume average particle size. When the volume average particle size of copper particles is determined, a method of measuring a sample obtained by dispersing copper particles as a raw material or dry copper particles obtained by removing volatile components from a copper bonding paste in a dispersion medium using a dispersant using a light scattering method particle size distribution measuring device (for example, a nanoparticle size distribution measuring device (SALD-7500 nano, commercially available from Shimadzu Corporation)) can be used for determination. When a light scattering method particle size distribution measuring device is used, hexane, toluene, α-terpineol, pure water, or the like can be used as the dispersion medium.

In order to obtain effects such as reduction in synthesis costs of submicro copper particles, favorable dispersibility, and reduction in the amount of a surface treatment agent used, the volume average particle size of the submicro copper particles is preferably 0.15 μm or more, more preferably 0.2 μm or more, and particularly preferably 0.3 μm or more, and in order to improve sinterability of the submicro copper particles, the volume average particle size is preferably 0.6 μm or less, more preferably 0.5 μm or less, and still more preferably 0.45 μm or less.

The average secondary particle size of the submicro copper particles may be 0.12 μm or more or 0.15 μm or more and may be 0.8 μm or less. The average secondary particle size of the submicro copper particles in this specification is the maximum particle size, and is obtained, for example, by a method of observing submicro copper particles or dry copper particles obtained by removing volatile components from the copper bonding paste 1 under a scanning electron microscope (SEM).

When the shape of submicro copper particles is not spherical, the average secondary particle size (maximum particle size) can be determined by the following method. That is, copper particle powder is placed on an SEM carbon tape with a spatula to prepare an SEM sample. This SEM sample is observed at a magnification of 10,000 using an SEM device. A rectangle circumscribing the copper particles in the SEM image is drawn by image processing software, and the long side of the rectangle is defined as the major axis of the particles. The major axis represents the maximum particle size.

The shape of the submicro copper particles is not particularly limited. Examples of the shape of the submicro copper particles includes a spherical shape, a lump shape, a needle shape, a flake shape, a substantially spherical shape and an aggregate thereof. In consideration of dispersibility and fillability, the shape of the submicro copper particles may be a spherical shape, a substantially spherical shape, or a flake shape. The submicro copper particles preferably have a spherical shape or a substantially spherical shape in order to minimize the occurrence of voids when the copper bonding paste is sintered. In this specification, the term "flake shape" includes a flat plate shape such as a plate shape and a scale shape.

The aspect ratio of the submicro copper particles is preferably 5 or less in consideration of dispersibility and fillability and in order to minimize the occurrence of voids after sintering. Also in consideration of this, the aspect ratio of the submicro copper particles is more preferably 3 or less, and still more preferably 1.5 or less. In this specification, the "aspect ratio" indicates the long side/thickness of the particles. The long side and the thickness of the particles can be measured from, for example, an SEM image of the submicro copper particles.

The submicro copper particles may be treated with a specific surface treatment agent. Examples of surface treatment agents include an organic acid having 8 to 16 carbon atoms. Examples of organic acids having 8 to 16 carbon atoms include saturated fatty acids such as caprylic acid, methylheptanic acid, ethylhexanoic acid, propylpentanoic acid, pelargonic acid, methyloctanoic acid, ethylheptanic acid, propyl hexanoic acid, capric acid, methylnonanoic acid, ethyloctanoic acid, propylheptanic acid, butylhexanic acid, undecanoic acid, methyldecanoic acid, ethylnonanoic acid, propyloctanoic acid, butylheptanic acid, lauric acid, methylundecanoic acid, ethyldecanoic acid, propylnonanoic acid, butyloctanoic acid, pentylheptanoic acid, tridecanoic acid, methyldodecanoic acid, ethylundecanoic acid, propyldecanoic acid, butylnonanoic acid, pentyloctanoic acid, myristic acid, methyltridecanoic acid, ethyl dodecanoic acid, propylundecanoic acid, butyldecanoic acid, pentylnonanoic acid, hexyloctanoic acid, pentadecanoic acid, methyltetradecanoic acid, ethyltridecanoic acid, propyldodecanoic acid, butylundecanoic acid, pentyldecanoic acid, hexylnonanoic acid, palmitic acid, methylpentadecane acid, ethyltradecanoic acid, propyltridecanoic acid, butyldodecanoic acid, pentylundecanoic acid, hexyldecanoic acid, heptylnonanoic acid, methylcyclohexanecarboxylic acid, ethylcyclohexanecarboxylic acid, propylcyclohexanecarboxylic acid, butylcyclohexanecarboxylic acid, pentylcyclohexanecarboxylic acid, hexylcyclohexanecarboxylic acid, heptylcyclohexanecarboxylic acid, octylcyclohexanecarboxylic acid, and nonylcyclohexanecarboxylic acid; unsaturated fatty acids such as octenoic acid, nonenoic acid, methyl nonenoic acid, decenoic acid, undecenoic acid, dodecenoic acid, tridecenoic acid, tetradecenoic acid, myristoleic acid, pentadecenoic acid, hexadecenoic acid, palmitoleic acid, and sapienic acid; and aromatic carboxylic acids such as terephthalic acid, pyromellitic acid, o-phenoxybenzoic acid, methylbenzoic acid, ethylbenzoic acid, propylbenzoic acid, butylbenzoic acid, pentylbenzoic acid, hexylbenzoic acid, heptylbenzoic acid, octylbenzoic acid, and nonylbenzoic acid. These organic acids may be used alone or two or more thereof may be used in combination. When such an organic acid and the submicro copper particles are combined, there is a tendency for both dispersibility of the submicro copper particles and desorption of the organic acid during sintering to be achieved.

The treatment amount of the surface treatment agent may be an amount of one-molecule layer to three-molecule layer attached to the surface of the submicro copper particles. This amount can be calculated from the number of molecular layers (n) attached to the surface of the submicro copper particles, a specific surface area ($A_p$) (unit m$^2$/g) of the submicro copper particles, a molecular weight ($M_s$) (unit g/mol) of the surface treatment agent, a minimum coverage area ($S_S$) (unit m$^2$/pieces) of the surface treatment agent, and Avogadro's number ($N_A$) ($6.02 \times 10^{23}$). Specifically, the treatment amount of the surface treatment agent is calculated according to the formula of treatment amount (mass %) of surface treatment agent=$\{(n \cdot A_p \cdot M_s)/(S_S \cdot N_A + n \cdot A_p \cdot M_s)\} \times 100\%$.

The specific surface area of the submicro copper particles can be calculated by measuring the dried submicro copper particles by a BET specific surface area measurement method. The minimum coverage area of the surface treatment agent is $2.05 \times 10^{-19}$ m$^2$/1 molecule when the surface treatment agent is a linear saturated fatty acid.

For example, the minimum coverage area of other surface treatment agents can be computed from a molecular model or measured by a method described in "Chemistry and Education" (Katsuhiro Ueda, Sumio Inafuku, and Iwao Mori, 40 (2), 1992, pp 114-117). An example of a method for quantifying a surface treatment agent is shown. The surface treatment agent can be identified by thermal desorption gas/gas chromatography mass spectrometry of dry powder obtained by removing the dispersion medium from the copper bonding paste, and thereby the number of carbon atoms and the molecular weight of the surface treatment agent can be determined. A carbon content proportion of the surface treatment agent can be analyzed by carbon content analysis. Examples of carbon content analysis methods include a high frequency induction heating furnace combustion/infrared absorption method. The amount of the surface treatment agent can be calculated from the identified number of carbon atoms and molecular weight of the surface treatment agent and the carbon content proportion according to the above formula.

The treatment amount of the surface treatment agent may be 0.07 mass % or more and 2.1 mass % or less, 0.10 mass % or more and 1.6 mass % or less, or 0.2 mass % or more and 1.1 mass % or less.

When the submicro copper particles are treated with a surface treatment agent, it is possible to further reduce the volumetric shrinkage during sintering and further increase the bonding strength compared with when copper particles (for example, cupric oxide (CuO), cuprous oxide ($Cu_2O$)) of which surfaces are not treated are used. This is because the volumetric shrinkage during sintering due to the reduction in the dispersion medium and copper oxide is reduced. The content of carbon contained in the submicro copper particles is about 0.5 to 1 mass %, and the volumetric shrinkage during sintering is reduced. Thereby, even if volumetric shrinkage during sintering occurs due to the surface treatment agent, it is easy to secure the bonding strength in the bonded object.

Regarding the submicro copper particles according to the present embodiment, commercially available particles can be used. Examples of commercially available submicro particles include CH-0200 (a volume average particle size of 0.36 μm, commercially available from Mitsui Mining & Smelting Co., Ltd.), HT-14 (a volume average particle size of 0.41 μm, commercially available from Mitsui Mining & Smelting Co., Ltd.), CT-500 (a volume average particle size of 0.72 μm, commercially available from Mitsui Mining & Smelting Co., Ltd.), and Tn-Cu100 (a volume average particle size of 0.12 μm, commercially available from Taiyo Nippon Sanso Corporation).

In order to easily obtain a bonded object having excellent bonding strength without performing bonding at a high pressure and in order to further improve applicability of the copper bonding paste, the content of the submicro copper particles with respect to a total mass of the metal particles is 95 mass % or more. Also in consideration of this, the content of the submicro copper particles with respect to a total mass of the metal particles may be 96 mass % or more, 98 mass % or more or 99 mass % or more and may be 100 mass %. In particular, when the copper bonding paste is used for bonding a semiconductor element, if the content of the submicro copper particles is within the above range, a semiconductor device tends to exhibit favorable die shear strength and connection reliability.

In order to easily obtain a bonded object having excellent bonding strength without performing bonding at a high pressure and in order to further improve applicability of the copper bonding paste, the content of the submicro copper particles based on a total amount of the copper bonding paste is preferably 40 mass % or more, more preferably 50 mass % or more, and still more preferably 70 mass % or more, and preferably 95 mass % or less, more preferably 92 mass % or less, and still more preferably 80 mass % or less.

The metal particles may further include micro copper particles in addition to the submicro copper particles. In this specification, the micro copper particles are copper particles having a volume average particle size of 2 µm or more and 50 µm or less. A method for measuring a volume average particle size is the same as the method for measuring submicro copper particles described above.

In order to easily obtain a bonded object having excellent bonding strength without performing bonding at a high pressure and in order to further improve applicability of the copper bonding paste, the content of the micro copper particles with respect to a total mass of the metal particles is preferably 5 mass % or less, more preferably 3 mass % or less, and still more preferably 1 mass % or less. The metal particles may not include micro copper particles.

The metal particles may include metal particles other than the above copper particles, and may include, for example, zinc, nickel, silver, gold, palladium, or platinum particles. The volume average particle size of the other metal particles may be 0.01 µm or more and 10 µm or less, 0.01 µm or more and 5 µm or less, or 0.05 µm or more and 3 µm or less. When other metal particles are contained, the content thereof with respect to a total mass of the metal particles may be 5 mass % or less, 3 mass % or less, or 1 mass % or less in order to obtain sufficient bondability. Other metal particles may not be included. The shape of other metal particles is not particularly limited.

When metal particles other than copper particles are contained, since a sintered object in which a plurality of types of metals are solid-dissolved or dispersed can be obtained, mechanical properties such as yield stress and fatigue strength of the sintered object are improved, and connection reliability is likely to be improved. In addition, when a plurality of types of metals particles are added, the sintered object of the copper bonding paste 1 can have sufficient bonding strength with respect to a specific adherend. When the copper bonding paste 1 is used for bonding a semiconductor element, the die shear strength and connection reliability of the semiconductor device are likely to be improved.

In order to easily obtain a bonded object having excellent bonding strength without performing bonding at a high pressure and in order to further improve applicability of the copper bonding paste, the content of the metal particles with respect to a total mass of the copper bonding paste is 50 mass % or more. Also in consideration of this, the content of the metal particles with respect to a total mass of the copper bonding paste is preferably 60 mass % or more, more preferably 65 mass % or more, and still more preferably 70 mass % or more, and in order to further improve applicability of the copper bonding paste, the content of the metal particles is preferably 95 mass % or less, more preferably 90 mass % or less, still more preferably 85 mass % or less, and particularly preferably 80 mass % or less.

The dispersion medium is not particularly limited, and may be volatile. Examples of volatile dispersion mediums include alcohols (monovalent and multivalent alcohols) such as pentanol, hexanol, heptanol, octanol, decanol, ethylene glycol, diethylene glycol, propylene glycol, butylene glycol, α-terpineol, and isobornylcyclohexanol (MTPH); ethers such as ethylene glycol butyl ether, ethylene glycol phenyl ether, diethylene glycol methyl ether, diethylene glycol ethyl ether, diethylene glycol monobutyl ether, diethylene glycol monoisobutyl ether, diethylene glycol hexylether, triethylene glycol methyl ether, diethylene glycol dimethyl ether, diethylene glycol diethyl ether, diethylene glycol dibutyl ether, diethylene glycol butyl methyl ether, diethylene glycol isopropyl methyl ether, triethylene glycol dimethyl ether, triethylene glycol butyl methyl ether, propylene glycol propyl ether, dipropylene glycol methyl ether, dipropylene glycol ethyl ether, dipropylene glycol propyl ether, dipropylene glycol butyl ether, dipropylene glycol dimethyl ether, tripropylene glycol methyl ether, and tripropylene glycol dimethyl ether; esters such as ethylene glycol ethyl ether acetate, ethylene glycol butyl ether acetate, diethylene glycol ethyl ether acetate, diethylene glycol butyl ether acetate, dipropylene glycol methyl ether acetate (DPMA), ethyl lactate, butyl lactate, γ-butyrolactone, and propylene carbonate; acid amides such as N-methyl-2-pyrrolidone, N,N-dimethylacetamide, and N,N-dimethylformamide; aliphatic hydrocarbons such as cyclohexanone, octane, nonane, decane, and undecane; aromatic hydrocarbons such as benzene, toluene, and xylene; mercaptans having an alkyl group having 1 to 18 carbon atoms; and mercaptans having a cycloalkyl group having 5 to 7 carbon atoms. Examples of mercaptans having an alkyl group having 1 to 18 carbon atoms include ethyl mercaptan, n-propyl mercaptan, i-propyl mercaptan, n-butyl mercaptan, i-butyl mercaptan, t-butyl mercaptan, pentyl mercaptan, hexylmercaptan and dodecyl mercaptan. Examples of mercaptans having a cycloalkyl group having 5 to 7 carbon atoms include cyclopentyl mercaptan, cyclohexyl mercaptan and cycloheptyl mercaptan. The dispersion mediums may be used alone or two or more thereof may be used in combination.

In order to further improve applicability of the copper bonding paste 1, the dispersion medium is preferably at least one selected from the group consisting of alcohols and ethers, and more preferably at least one selected from the group consisting of diethylene glycol monobutyl ether, α-terpineol, MTPH, and cyclohexanone. The dispersion medium may be a mixture containing diethylene glycol monobutyl ether and α-terpineol, or a mixture containing α-terpineol and MTPH.

The content of the dispersion medium may be 5 to 50 parts by mass with respect to 100 parts by mass of the metal particles. When the content of the dispersion medium is within the above range, the copper bonding paste 1 can be adjusted so that it has a more appropriate viscosity and sintering of the copper particles can be less likely to be hindered.

In order to further improve applicability of the copper bonding paste 1, the content of the dispersion medium with respect to a total mass of the copper bonding paste is preferably 5 mass % or more, more preferably 10 mass % or more, and still more preferably 20 mass % or more and preferably 70 mass % or less, more preferably 50 mass % or less, and still more preferably 30 mass % or less.

In addition to the metal particles and the dispersion medium, as necessary, wettability improving agents such as a nonionic surfactant and a fluorine-based surfactant; antifoaming agents such as silicone oil; and ion trapping agents such as an inorganic ion exchanger may be appropriately added to the copper bonding paste 1. The above surface treatment agent may be added as an additive.

In order to further improve the bonding strength of a bonded object 100, the viscosity of the copper bonding paste 1 at 25° C. is preferably 0.8 Pa·s or more, more preferably 10 Pa·s or more, still more preferably 100 Pa·s or more, and particularly preferably 200 Pa·s or more, and in order to further improve applicability of the copper bonding paste 1, the viscosity is preferably 40,000 Pa·s or less, more preferably 30,000 Pa·s or less, still more preferably 10,000 Pa·s or less, and particularly preferably 1,000 Pa·s or less. The viscosity means Casson viscosity, and can be measured using a viscoelasticity measurement device. The viscosity of the copper bonding paste can be adjusted by adjusting the content of the metal particles and the dispersion medium or appropriately selecting the type of the dispersion medium.

The above copper bonding paste 1 can be prepared, for example, by mixing the above submicro copper particles, and as necessary, other materials into a dispersion medium. The dispersion solution after respective components are mixed may be stirred. In the copper bonding paste 1, the maximum particle size of the dispersion solution may be adjusted by a classification operation. In this case, the maximum particle size of the dispersion solution can be 10 μm or less or 5 μm or less.

When the copper bonding paste 1 contains metal particles other than the submicro copper particles, the submicro copper particles and the dispersion medium are mixed in advance, and subjected to a dispersion treatment to prepare a dispersion solution, and other metal particles and optional additives may be additionally mixed for preparation. According to such a procedure, an ability to mix other metal particles and optional additives is improved and the performance of the copper bonding paste is further improved. Aggregates may be removed by classifying the dispersion solution of the submicro copper particles.

Examples of dispersion treatments include treatments using, for example, a thin-layer shear dispersing machine, a bead mill, an ultrasonic homogenizer, a high shear mixer, a narrow gap three-roll mill, a wet atomizing device, a supersonic jet mill, an ultra-high pressure homogenizer, and a disparizer.

The stirring treatment can be performed using a stirrer. Examples of stirrers include a rotation revolution type stirring device, a grinding machine, a twin-screw kneader, a three-roll mill, a planetary mixer, and a thin-layer shear dispersing machine. In addition, regarding the stirring treatment, a stirring treatment may be manually performed using a mortar. Then, a stirring treatment may be additionally performed using the above stirrer.

The classification operation can be performed using, for example, filtration, natural sedimentation, or centrifugation. Examples of filters for filtration include a metal mesh, a metal filter, and a nylon mesh.

The copper bonding paste 1 provided on the second member 3 or the first member 2 may be appropriately dried in order to minimize circulating during sintering and the occurrence of voids. The gas atmosphere during drying may be in an atmosphere, an oxygen-free atmosphere such as nitrogen or a rare gas, or a reducing atmosphere such as hydrogen or formic acid. The drying method may be drying by leaving at room temperature, heat drying, or vacuum drying. For heat drying or vacuum drying, for example, a hot plate, a warm-air dryer, a hot air heating furnace, a nitrogen dryer, an infrared dryer, an infrared heating furnace, a far infrared heating furnace, a microwave heating device, a laser heating device, an electromagnetic heating device, a heater heating device, a steam heating furnace, a hot plate pressing device, and the like can be used. The drying temperature and time may be appropriately adjusted according to the type and amount of the dispersion medium used. The drying temperature and time may be, for example, 50° C. or higher and 180° C. or lower and 1 minute or longer and 120 minutes or shorter.

[Sintering Step]

Next, as shown in FIG. 1(*d*), the copper bonding paste 1 in the laminate 4 is sintered under a pressure of 0.1 to 1 MPa.

In the sintering step, the laminate 4 is pressurized and heated in a lamination direction of the laminate 4, that is, in a direction indicated by the arrow in FIG. 1(*d*). The lamination direction of the laminate 4 can be a direction in which an own weight of the first member 2 acts or a direction in which the gravity acts.

The pressure during pressurization is 0.1 to 1 MPa. Thereby, it is not necessary to pressurize at a high pressure and the yield can be further improved. In addition, it is possible to reduce the number of voids in the bonded object and further improve the die shear strength. In order to reduce the number of voids in the bonded object and further improve the die shear strength, the pressure is preferably 0.2 MPa or more, more preferably 0.3 MPa or more, and still more preferably 0.4 MPa or more, and in order to further improve the yield of the copper bonding paste, the pressure is preferably 0.8 MPa or less, more preferably 0.7 MPa or less, and still more preferably 0.6 MPa or less.

In order to reduce heat damage to the first member 2 and the second member 3 and improve the yield, the maximum arrival temperature during the heat treatment may be 250° C. or higher and 450° C. or lower, 250° C. or higher and 400° C. or lower, or 250° C. or higher and 350° C. or lower. When the maximum arrival temperature is 200° C. or higher, sufficient sintering tends to proceed when the maximum arrival temperature retention time is 60 minutes or less.

In order to volatilize the dispersion medium completely and improve the yield, the maximum arrival temperature retention time may be 1 minute or longer and 120 minutes or shorter, 1 minute or longer and 80 minutes or shorter, or 1 minute or longer and 60 minutes or shorter.

The laminate 4 may be pressurized and heated using a combination of a heat treatment device and a pressurization treatment device or using a heating and pressurizing treatment device. Regarding the heat treatment device, for example, a hot plate, warm-air dryer, a hot air heating furnace, a nitrogen dryer, an infrared dryer, an infrared heating furnace, a far infrared heating furnace, a microwave heating device, a laser heating device, an electromagnetic heating device, a heater heating device, a steam heating furnace, a vacuum soldering device, and a reflow furnace can be used. Regarding the pressurization treatment device, a carbon or metal pressurization jig, a weight, a double clip and the like can be used. More specifically, for example, a weight can be used as the pressurization treatment device, and a batch type vacuum soldering device (for example, commercially available from Shinko Seiki Co., Ltd.) can be used in combination as the heat treatment device.

Regarding the heating and pressurizing treatment device, a hot plate pressing device (for example, SIN200+(commercially available from PINK GmbH Thermo systeme)), a heating roll press or the like can be used.

The gas atmosphere during sintering may be an oxygen-free atmosphere in order to minimize oxidation of the sintered object of the copper bonding paste 1, the first member and the second member. The gas atmosphere during sintering may be a reducing atmosphere in order to remove surface oxides of copper particles of the copper bonding paste. Examples of oxygen-free atmospheres include an atmosphere in which an oxygen-free gas such as nitrogen or a rare gas is introduced and a vacuum atmosphere. Examples of reducing atmospheres include pure hydrogen gas, a mixed gas containing hydrogen and nitrogen represented by a forming gas, nitrogen containing formic acid gas, a mixed gas containing hydrogen and a rare gas, and a rare gas containing formic acid gas.

When the copper bonding paste 1 is sintered, as shown in FIG. 1(e), the bonded object 100 including the first member 2, a sintered object 5 of a copper bonding paste, and the second member 3 in order can be obtained. That is, the bonded object 100 according to one embodiment includes the first member 2, the second member 3, and the sintered object 5 of the copper bonding paste that bonds the first member and the second member.

In order for the first member and the second member to sufficiently bond, the die shear strength of the bonded object may be 10 MPa or more, 15 MPa or more, 20 MPa or more, or 30 MPa or more. The die shear strength can be measured using a universal bond tester (for example, 4000 series commercially available from DAGE), a universal bond tester (for example, Royce 650 commercially available from Royce Instruments), or the like.

In order to obtain excellent heat dissipation and connection reliability under a high temperature, the thermal conductivity of the sintered object of the copper bonding paste may be 100 W/(m·K) or more, 120 W/(m·K) or more, or 150 W/(m·K) or more. The thermal conductivity can be calculated from the thermal diffusivity, the specific heat capacity, and the density of the sintered object 5 of the copper bonding paste.

[Method for Producing Semiconductor Device]

Next, a method for producing a semiconductor device will be described. In the method for producing the bonded object 100 described above, when at least one of the first member and the second member is a semiconductor element, a semiconductor device can be produced by the above method for producing a bonded object. That is, the method for producing a semiconductor device according to one embodiment is the above method for producing a bonded object in which the first member and/or the second member is replaced with a semiconductor element, the method including a step of preparing a laminate in which a first member, a copper bonding paste, and a second member are laminated in order and a step of sintering the copper bonding paste under a pressure of 0.1 to 1 MPa, wherein at least one of the first member and the second member is a semiconductor element, the copper bonding paste contains metal particles and a dispersion medium, the content of the metal particles with respect to a total mass of the copper bonding paste is 50 mass % or more, and the metal particles contain 95 mass % or more of submicro copper particles with respect to a total mass of the metal particles.

The semiconductor element used in the first member and/or the second member may be, for example, a power module including a diode, a rectifier, a thyristor, a MOS gate driver, a power switch, a power MOSFET, an IGBT, a Schottky diode, a fast recovery diode, and the like, a transmitter, an amplifier, and an LED module.

Figure 2:
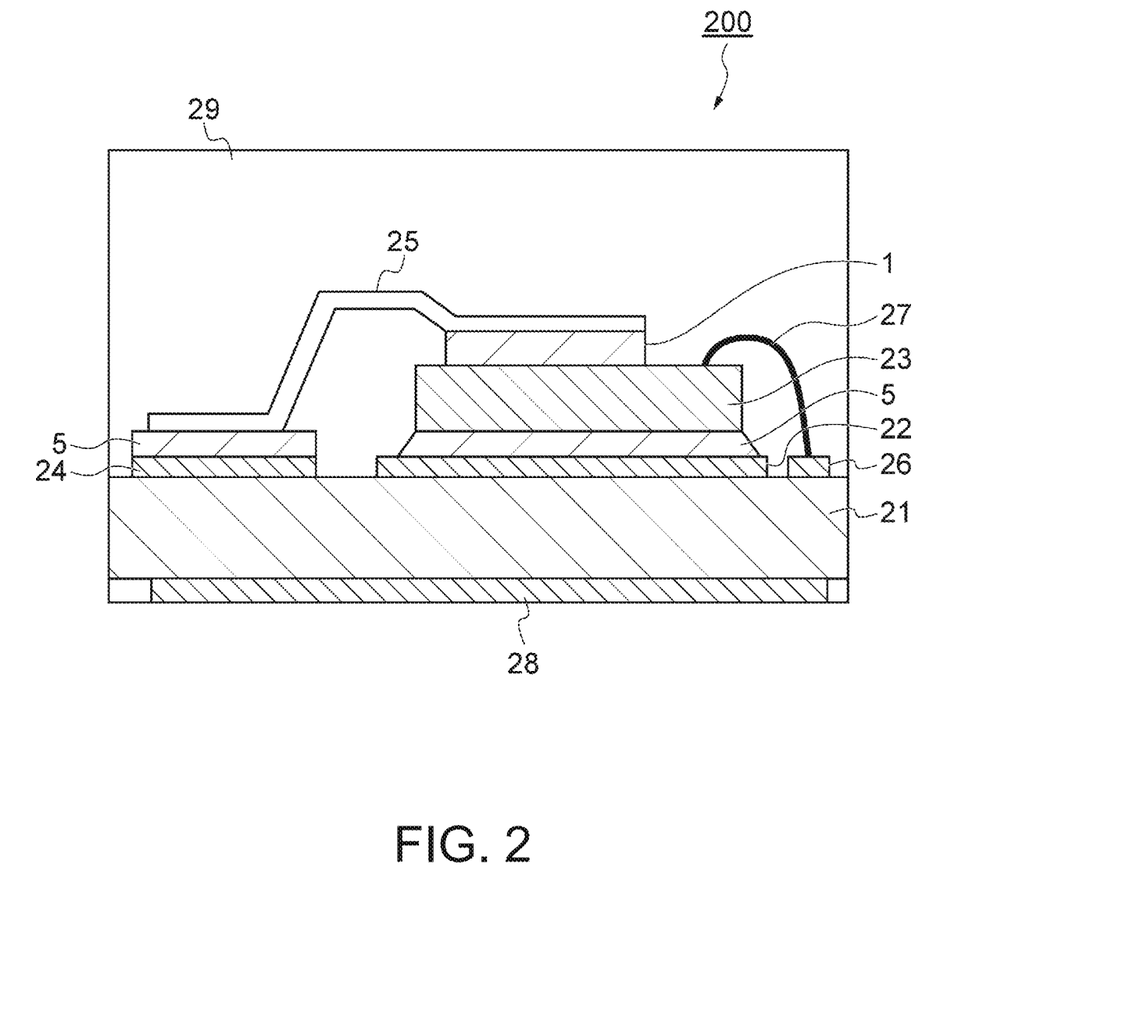
FIG. 2 is a schematic cross-sectional view for explaining a method for producing a semiconductor device according to one embodiment.

FIG. 2 is a schematic cross-sectional view showing an example of a semiconductor device obtained by the production method according to the present embodiment. A semiconductor device 200 shown in FIG. 2 includes an insulation substrate 21 including a first electrode 22 and a second electrode 24, a semiconductor element 23 bonded onto the first electrode 22 with the sintered object 5 of the copper bonding paste, and a metal wiring 25 for electrically connecting the semiconductor element 23 and the second electrode 24. The metal wiring 25 and the semiconductor element 23, and the metal wiring 25 and the second electrode 24 are bonded with the sintered object 5 of the copper bonding paste. In addition, the semiconductor element 23 is connected to a third electrode 26 via a wire 27. The semiconductor device 200 includes a copper plate 28 on the side opposite to the surface of the insulation substrate 21 on which the above electrodes and the like are mounted. In the semiconductor device 200, the structure is sealed with an insulator 29. The semiconductor device 200 includes one semiconductor element 23 on the first electrode 22, but may include two or more semiconductor elements. In this case, each of the plurality of semiconductor elements 23 can be bonded to the metal wiring 25 with the sintered object 5 of the copper bonding paste.

EXAMPLES

The present invention will be described below in more detail with reference to examples. However, the present invention is not limited to the following examples.

<Preparation of Copper Bonding Paste>

0.9 g of diethylene glycol monobutyl ether (commercially available from Wako Pure Chemical Industries, Ltd.) as a dispersion medium and 9.1 g of CH-0200 (commercially available from Mitsui Mining & Smelting Co., Ltd.) as submicro copper particles were kneaded in an agate mortar until there was no dry powder, and the obtained mixed solution was transferred to a plastic container. The sealed plastic container was stirred using a rotation revolution type stirring device (Planetary Vacuum Mixer ARV-310, commercially available from Thinky Corporation) at 2,000 min$^{-1}$ (2,000 rpm) for 2 minutes. This mixed solution was used as a copper bonding paste 1.

In addition, copper bonding pastes 2 to 17 were prepared in the same method for the copper bonding paste 1 except that compositions were changed as shown in Tables 1 to 3.

<Measurement of Viscosity>

The viscosities of the copper bonding pastes 1 to 17 at 25° C. were measured using a viscoelasticity measurement device (MCR102, commercially available from Anton Paar). In measurement conditions, the gap was 0.2 mm, the strain was 2%, and the frequency was 0.5 Hz. The viscosities of the copper bonding pastes 5 minutes after measurement started are shown in Tables 1 to 3.

<Production of Bonded Object>

Bonded objects were produced using the copper bonding pastes 1 to 17 according to the following method. The die shear strength of the bonded object was measured by the method to be described below.

A stainless steel metal mask (thickness: 200 μm) having a 3 mm×3 mm square opening was placed on a 19 mm×25 mm copper plate (thickness: 3 mm), and the copper bonding paste was applied by stencil printing using a metal squeegee. This was heated on a hot plate set at 90° C. in the atmosphere for 30 minutes, and a silicon chip (thickness: 400 μm) with a 3 mm×3 mm adherend surface on which titanium (50 nm) and nickel (100 nm) were sputtered in order was placed and lightly pressed with tweezers. This sample was set in a batch type vacuum soldering furnace (commercially available from Shinko Seiki Co., Ltd.) and pressurized at 0.5 MPa and then heated under a hydrogen 100% atmosphere for 30 minutes. After the heating, under conditions of a maximum arrival temperature of 300° C. and a maximum arrival temperature retention time of 60 minutes, sintering was performed to obtain a bonded object in which a copper plate and a nickel-sputtered silicon chip were bonded. After the sintering, the bonded object was taken out into the air at 50° C. or lower.

<Evaluation Method>

[Die Shear Strength]

The bonding strength of the bonded object was evaluated according to the die shear strength. For the produced bonded object, a copper block was horizontally pushed using a universal bond tester (Royce 650, commercially available from Royce Instruments) with a load cell (SMS-200K-24200, commercially available from Royce Instruments) attached thereto at a measurement speed of 5 mm/min and a measurement height of 50 μm, and the die shear strength of the bonded object was measured. The average value of the measured values for 8 bonded objects was used as the die shear strength. The evaluation indexes are as follows. If the evaluation is S or A, it can be said that the die shear strength is excellent.

Evaluation Index:
  S: 30 MPa or more
  A: 20 MPa or more and less than 30 MPa
  B: 10 MPa or more and less than 20 MPa
  C: less than 10 MPa

[Evaluation of Applicability]

The applicability of the copper bonding paste was evaluated by applying the copper bonding paste using a stainless steel metal mask (thickness: 200 μm) having a 10 mm×10 mm square opening. The evaluation indexes are as follows. If the evaluation is S or A, it can be said that the applicability is excellent.

Evaluation Index:
  S: Could be applied without blurring and the paste did not flow out of the opening
  A: Slight blurring occurred, but the paste was not squeezed out of the opening. Or, it could be applied without blurring, but the paste slightly flowed out of the opening.
  B: Blurring occurred, but the paste was not squeezed out of the opening. Or, it could be applied without blurring, and the paste flowed out of the opening.
  C: Significant blurring occurred, but the paste was not squeezed out of the opening. Or, it could be applied without blurring, but the paste significantly flowed out of the opening.

TABLE 1

|  |  |  | Example 1 | Example 2 | Example 3 | Example 4 | Example 5 | Example 6 |
|---|---|---|---|---|---|---|---|---|
| Paste No. |  |  | 1 | 2 | 3 | 4 | 5 | 6 |
| Composition | Metal particles (g) | Submicro copper particles | 9.1 | 8 | 7 | 6 | 5 | 9.1 |
|  |  | Micro copper particles | — | — | — | — | — | — |
|  |  | Zinc particles | — | — | — | — | — | — |
|  |  | Silver particles | — | — | — | — | — | — |
|  | Dispersion medium (g) | Diethylene glycol monobutyl ether | 0.9 | 2 | 3 | 4 | 5 | — |
|  |  | α-terpineol | — | — | — | — | — | 0.9 |
|  |  | MTPH | — | — | — | — | — | — |
|  |  | Cyclohexanone | — | — | — | — | — | — |
|  | Content of submicro copper particles with respect to a total mass of metal particles (mass %) |  | 100 | 100 | 100 | 100 | 100 | 100 |
|  | Content of metal particles with respect to a total mass of copper paste (mass %) |  | 91 | 80 | 70 | 60 | 50 | 91 |
| Physical property | Viscosity of copper paste (Pa · s) |  | 33,000 | 10,000 | 210 | 50 | 0.8 | 32,000 |
| Pressurization condition | Pressure (Mpa) |  | 0.5 | 0.5 | 0.5 | 0.5 | 0.5 | 0.5 |
| Evaluation | Die shear strength |  | S | S | S | A | A | A |
|  | Applicability |  | A | S | S | A | A | A |

TABLE 2

|  |  |  | Example 7 | Example 8 | Example 9 | Example 10 | Example 11 |
|---|---|---|---|---|---|---|---|
| Paste No. |  |  | 7 | 8 | 9 | 10 | 11 |
| Composition | Metal particles (g) | Submicro copper particles | 9.1 | 9.1 | 9.1 | 9.08 | 9.08 |
|  |  | Micro copper particles | — | — | — | — | — |
|  |  | Zinc particles | — | — | — | 0.02 | — |
|  |  | Silver particles | — | — | — | — | 0.02 |

TABLE 2-continued

|  |  |  | Example 7 | Example 8 | Example 9 | Example 10 | Example 11 |
|---|---|---|---|---|---|---|---|
|  | Dispersion medium (g) | Diethylene glycol monobutyl ether | 0.45 | — | — | 0.9 | 0.9 |
|  |  | α-terpineol | 0.45 | 0.8 | 0.8 | — | — |
|  |  | MTPH | — | — | 0.1 | — | — |
|  |  | Cyclohexanone | — | 0.1 | — | — | — |
|  | Content of submicro copper particles with respect to a total mass of metal particles (mass %) |  | 100 | 100 | 100 | 99.8 | 99.8 |
|  | Content of metal particles with respect to a total mass of copper paste (mass %) |  | 91 | 91 | 91 | 91 | 91 |
| Physical property | Viscosity of copper paste (Pa · s) |  | 30,000 | 29,000 | 36,000 | 33,000 | 33,000 |
| Pressurization condition | Pressure (Mpa) |  | 0.5 | 0.5 | 0.5 | 0.5 | 0.5 |
| Evaluation | Die shear strength |  | A | S | S | S | S |
|  | Applicability |  | A | A | A | A | A |

TABLE 3

|  |  |  | Comparative Example 1 | Comparative Example 2 | Comparative Example 3 | Comparative Example 4 | Comparative Example 5 | Comparative Example 6 |
|---|---|---|---|---|---|---|---|---|
| Paste No. |  |  | 12 | 13 | 14 | 15 | 16 | 17 |
| Composition | Metal particles (g) | Submicro copper particles | 4 | 3 | 3 | 3 | 3 | — |
|  |  | Micro copper particles | — | — | — | — | — | 7 |
|  |  | Zinc particles | — | — | — | — | — | — |
|  |  | Silver particles | — | — | — | — | — | — |
|  | Dispersion medium (g) | Diethylene glycol monobutyl ether | 6 | 7 | — | — | — | 3 |
|  |  | α-terpineol | — | — | 7 | — | 4 | — |
|  |  | MTPH | — | — | — | 7 | 3 | — |
|  |  | Cyclohexanone | — | — | — | — | — | — |
|  | Content of submicro copper particles with respect to a total mass of metal particles (mass %) |  | 100 | 100 | 100 | 100 | 100 | — |
|  | Content of metal particles with respect to a total mass of copper paste (mass %) |  | 40 | 30 | 30 | 30 | 30 | 70 |
| Physical property | Viscosity of copper paste (Pa · s) |  | 0.1 | 0.05 | 0.05 | 350 | 150 | 50 |
| Pressurization condition | Pressure (Mpa) |  | 0.5 | 0.5 | 0.5 | 0.5 | 0.5 | 0.5 |
| Evaluation | Die shear strength |  | B | B | B | B | B | C |
|  | Applicability |  | B | C | C | C | B | C |

[Observation of Cross Section Morphology]

A bonded object was fixed in a cup with a sample clip (Samplklip I, commercially available from Buehler), an epoxy casting resin (Epo-Mount, commercially available from Refine Tec Ltd.) was poured into the surroundings until the entire sample was filled, and left in a vacuum desiccator, and defoamed by depressurizing for 1 minute. Then, the epoxy casting resin was cured by leaving it at room temperature (25° C.) for 10 hours. A Refine Saw Low (RCA-005, commercially available from Refine Tec Ltd.) with a diamond cutting wheel (11-304, commercially available from Refine Tec Ltd.) was used to cut near the cross section to be observed of the cast bonded object. The cross section was scraped with a polishing device (Refine Polisher Hv, commercially available from Refine Tec Ltd.) with waterproof abrasive paper (Carbon Mac Paper, commercially available from Refine Tec Ltd.), a crack-free cross section was formed on the silicon chip, and an extra casting resin was additionally scraped off to a size that could be applied to a CP (cross section polisher) processing machine. The cut sample was subjected to cross section polishing in a CP processing machine (IM4000, commercially available from Hitachi, Ltd.) under conditions of an acceleration voltage of 6 kV, an argon gas flow rate of 0.07 to 0.1 cm$^3$/min, and a treatment time of 2 hours, and the cross section was processed. Platinum was sputtered to a thickness of 10 nm on the cross section using a sputtering device (ION SPUTTER, commercially available from Hitachi High-Tech Corporation) to prepare a sample for SEM observation. For this SEM sample, the cross section of the bonded object was observed using an SEM device (ESEM XL30, commercially available from Philips) at an applied voltage of 10 kV.

Figure 3:
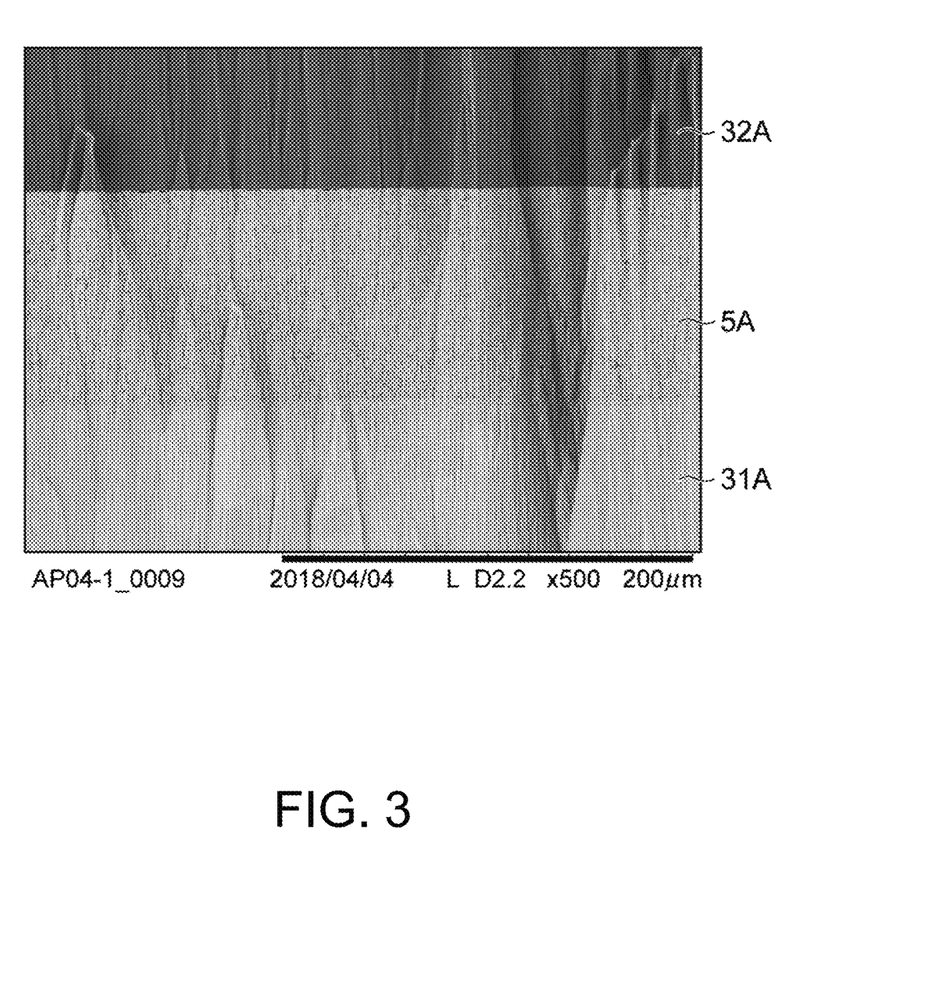
FIG. 3 is an SEM image of a cross section of a bonded object of Example 1.
Figure 4:
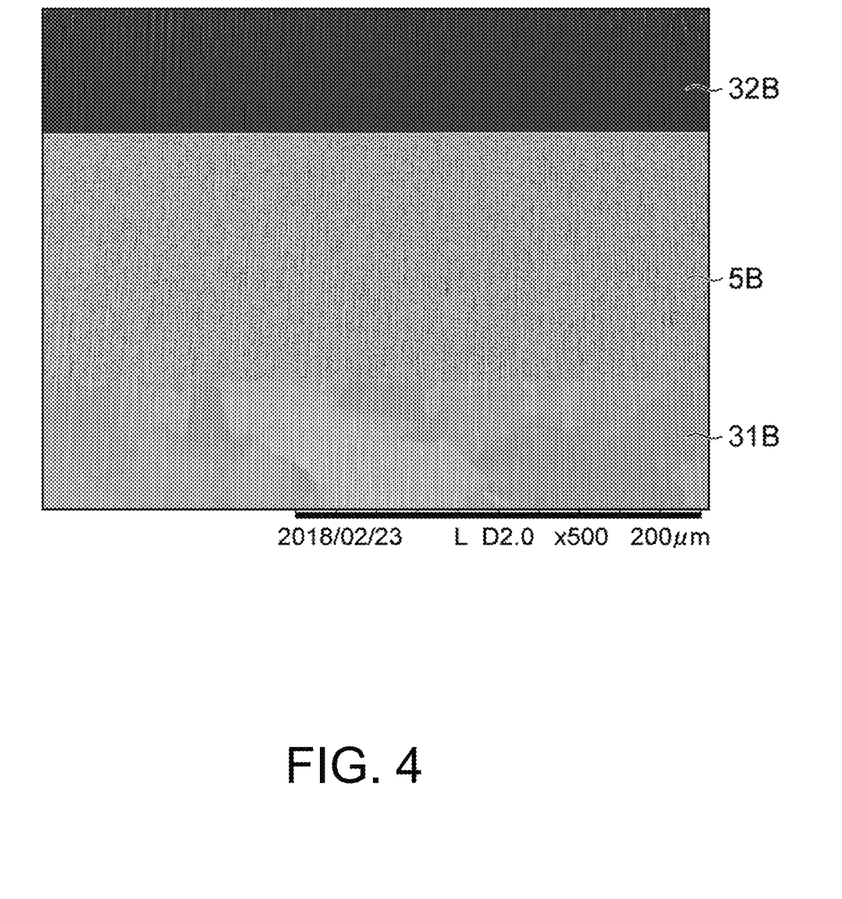
FIG. 4 is an SEM image of a cross section of a bonded object of Example 2.
Figure 5:
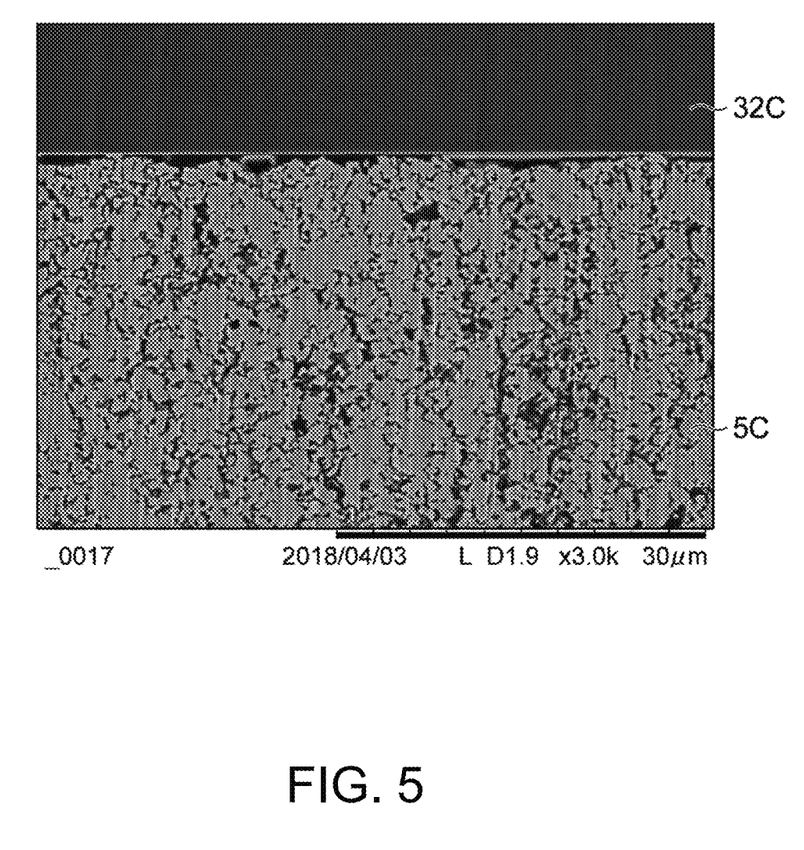
FIG. 5 is an SEM image of a cross section of a bonded object of Comparative Example 3.

FIG. 3 shows an SEM image of a cross section of a bonded object of Example 1, FIG. 4 shows an SEM image of a cross section of a bonded object of Example 2, and FIG. 5 shows an SEM image of a bonded object of Comparative Example 3. In FIGS. 3 and 4, it can be understood that, in the sintered object 5 (5A, 5B) of the copper bonding paste in Examples 1 and 2, nickel-plated copper plates 31A and 31B and titanium-, and nickel-sputtered silicon chips 32A and 32B could be satisfactorily bonded. On the other hand, in FIG. 5, it can be understood that, in the bonded object of Comparative Example 3, there was a variation in the bonding between a titanium-, and nickel-sputtered silicon chip 32C and the sintered object 5C of the copper bonding paste. Due to such a difference in the structure, it is considered that sufficient die shear strength was not obtained in the bonded object of Comparative Example 3.

The invention claimed is:

1. A method for producing a bonded object, comprising:
   a step of preparing a laminate in which a first member, a copper bonding paste, and a second member are laminated in order; and
   a step of sintering the copper bonding paste under a pressure of 0.1 to 1 MPa,
   wherein the copper bonding paste contains metal particles and a dispersion medium,
   a content of the metal particles with respect to a total mass of the copper bonding paste is 50 mass % or more, and
   the metal particles contain 95 mass % or more of submicro copper particles having a volume average particle size of 0.12 µm or more and 0.8 µm or less with respect to a total mass of the metal particles.

2. A method for producing a semiconductor device, comprising:
   a step of preparing a laminate in which a first member, a copper bonding paste, and a second member are laminated in order; and
   a step of sintering the copper bonding paste under a pressure of 0.1 to 1 MPa,
   wherein at least one of the first member and the second member is a semiconductor element,
   the copper bonding paste contains metal particles and a dispersion medium,
   a content of the metal particles with respect to a total mass of the copper bonding paste is 50 mass % or more, and
   the metal particles contain 95 mass % or more of submicro copper particles having a volume average particle size of 0.12 µm or more and 0.8 µm or less with respect to a total mass of the metal particles.

3. A copper bonding paste comprising metal particles and a dispersion medium,
   wherein a content of the metal particles with respect to a total mass of the copper bonding paste is 50 mass % or more, and
   the metal particles contain 95 mass % or more of submicro copper particles having a volume average particle size of 0.12 µm or more and 0.8 µm or less with respect to a total amount of the metal particles.

4. The copper bonding paste according to claim 3,
   wherein the metal particles contain 5 mass % or less of micro copper particles with respect to a total mass of the metal particles.

5. The copper bonding paste according to claim 3,
   wherein a viscosity of the copper bonding paste at 25° C. is 0.8 to 40,000 Pa·s.

6. The copper bonding paste according to claim 3,
   wherein the dispersion medium is at least one selected from the group consisting of alcohols and ethers.

7. The copper bonding paste according to claim 3,
   wherein an aspect ratio of the submicro copper particles is 5 or less.

8. The method according to claim 1,
   wherein the step of sintering the copper bonding paste is conducted under a pressure of 0.1 to 0.8 MPa.

9. The method according to claim 2,
   wherein the step of sintering the copper bonding paste is conducted under a pressure of 0.1 to 0.8 MPa.

* * * * *